(12) United States Patent
Liu et al.

(10) Patent No.: US 6,831,350 B1
(45) Date of Patent: Dec. 14, 2004

(54) SEMICONDUCTOR STRUCTURE WITH DIFFERENT LATTICE CONSTANT MATERIALS AND METHOD FOR FORMING THE SAME

(75) Inventors: Chun-Li Liu, Mesa, AZ (US);
 Alexander L. Barr, Austin, TX (US);
 John M. Grant, Austin, TX (US);
 Bich-Yen Nguyen, Austin, TX (US);
 Marius K. Orlowski, Austin, TX (US);
 Tab A. Stephens, Austin, TX (US); Ted R. White, Austin, TX (US); Shawn G. Thomas, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/677,844

(22) Filed: Oct. 2, 2003

(51) Int. Cl.$^7$ ............................................. H01L 29/30
(52) U.S. Cl. ..................... 257/617; 257/616; 257/241; 257/243; 257/288; 257/368; 438/149; 438/150; 438/151; 438/163; 438/197; 438/430; 438/517
(58) Field of Search ................................ 257/617, 616, 257/241, 243, 288, 368; 438/149, 150, 151, 163, 197, 430, 517

(56) References Cited

U.S. PATENT DOCUMENTS

| | | |
|---|---|---|
| 4,522,662 A | 6/1985 | Bradbury et al. |
| 4,557,794 A | 12/1985 | McGinn et al. |
| 4,619,033 A | 10/1986 | Jastrzebski |
| 4,755,481 A | 7/1988 | Faraone |
| 4,760,036 A | 7/1988 | Schubert |
| 4,891,092 A | 1/1990 | Jastrzebski |
| 4,952,526 A | 8/1990 | Pribat et al. |
| 5,120,666 A | 6/1992 | Gotou |
| 5,202,284 A | 4/1993 | Kamins et al. |
| 5,273,921 A | 12/1993 | Neudeck et al. |
| 5,445,107 A | 8/1995 | Roth et al. |
| 5,963,817 A | * 10/1999 | Chu et al. ................... 438/410 |

(List continued on next page.)

FOREIGN PATENT DOCUMENTS

| | | |
|---|---|---|
| EP | 0 391 081 A2 | 3/1990 |
| WO | WO 03/001671 A2 | 1/2003 |
| WO | WO 03/015142 A2 | 2/2003 |

OTHER PUBLICATIONS

Langdo et al., "High Quality Ge on Si by Epitaxial Necking," *Applied Physics Letters*, Jun. 19, 2000, vol. 76, No. 25, pp. 3700–3702.

*Primary Examiner*—Nathan J. Flynn
*Assistant Examiner*—Remmon R. Fordé
(74) *Attorney, Agent, or Firm*—Michael J. Balconi-Lamica; Robert L. King

(57) ABSTRACT

A semiconductor structure includes a substrate comprising a first relaxed semiconductor material with a first lattice constant. A semiconductor device layer overlies the substrate, wherein the semiconductor device layer includes a second relaxed semiconductor material with a second lattice constant different from the first lattice constant. In addition, a dielectric layer is interposed between the substrate and the semiconductor device layer, wherein the dielectric layer includes a programmed transition zone disposed within the dielectric layer for transitioning between the first lattice constant and the second lattice constant. The programmed transition zone includes a plurality of layers, adjoining ones of the plurality of layers having different lattice constants with one of the adjoining ones having a first thickness exceeding a first critical thickness required to form defects and another of the adjoining ones having a second thickness not exceeding a second critical thickness. Each adjoining layer of the plurality of layers forms an interface for promoting defects in the transition zone to migrate to and terminate on an edge of the programmed transition zone. A method of making the same is also disclosed.

21 Claims, 4 Drawing Sheets

U.S. PATENT DOCUMENTS

| | | |
|---|---|---|
| 6,110,278 A | 8/2000 | Saxena |
| 6,214,653 B1 | 4/2001 | Chen et al. |
| 6,228,691 B1 | 5/2001 | Doyle |
| 6,261,878 B1 | 7/2001 | Doyle et al. |
| 6,326,272 B1 | 12/2001 | Chan et al. |
| 6,362,071 B1 | 3/2002 | Nguyen et al. |
| 6,392,253 B1 | 5/2002 | Saxena |
| 6,407,406 B1 * | 6/2002 | Tezuka ................. 257/18 |
| 6,429,099 B1 | 8/2002 | Christensen et al. |
| 6,492,216 B1 | 12/2002 | Yeo et al. |
| 6,600,170 B1 * | 7/2003 | Xiang ................. 257/18 |
| 6,703,688 B1 * | 3/2004 | Fitzergald ............. 257/616 |
| 2002/0123167 A1 | 9/2002 | Fitzgerald |
| 2002/0123183 A1 | 9/2002 | Fitzgerald |
| 2002/0125471 A1 | 9/2002 | Fitzgerald et al. |
| 2002/0125475 A1 | 9/2002 | Chu et al. |
| 2003/0025131 A1 | 2/2003 | Lee et al. |
| 2003/0057416 A1 | 3/2003 | Currie et al. |
| 2003/0057439 A1 | 3/2003 | Fitzgerald |

* cited by examiner

SEMICONDUCTOR STRUCTURE WITH DIFFERENT LATTICE CONSTANT MATERIALS AND METHOD FOR FORMING THE SAME

RELATED APPLICATION

This is related to U.S. patent application Ser. No. 10/677,573 filed concurrently herewith, and entitled "Semiconductor Device Incorporating a Defect Controlled Strained Channel Structure and Method of Making the Same" (Attorney Docket SC12480TP) and is incorporated herein by reference and assigned to the current assignee hereof.

BACKGROUND

1. Field of the Invention

This invention relates generally to semiconductors, and more specifically, to a semiconductor structure with different lattice constant materials and method for forming the same.

2. Related Art

Strained silicon (SS) technology has been known to increase channel carrier mobility by 30–60% compared to bulk silicon. Currently, thick graded and buffer layers of SiGe on the order of 3.5 µm are used for SS devices in order to produce relaxed SiGe on a Si wafer with low threading dislocation (TD) density. A thin strained Si layer epitaxially grown on the relaxed SiGe provides for the high carrier mobility in strained channel devices. TD density imposes threats to SS device performance, for example, including problems of shorting, undesired leakage current, etc.

To address the problem of threading dislocations in SS technology, prior techniques have included the inserting of SiGeC layers into a channel region of a semiconductor structure. Inserting the SiGeC layers strangles the TDs at a SiGeC/SiGe interface, wherein the TDs move along the interface instead of propagating vertically. Prior techniques have also included inserting Si layers in SiGe, as well as, inserting oxide layers in SiGe, both in an attempt to form a TD isolation structure. However, improvement upon such prior techniques is still needed.

Moreover, strained channel devices are desirable since enhanced charge carrier mobility in strained semiconductors results in improved device performance. Strained channel devices, however, are difficult to fabricate due to the unavailability of substrates of preferred materials (e.g., SiGe) on which to deposit a strained layer (e.g., Si). Numerous techniques have been proposed to fabricate "virtual substrates" of SiGe on conventional Si substrates, including, for example, the use of ramped Ge concentration and CMP of deposited layers. However, the later techniques use the wafer edge to terminate defects, which is problematic for defects near the wafer center. This issue will be worse for larger diameter substrates.

Accordingly, an improved semiconductor structure and method of making the same is desired.

SUMMARY

According to one embodiment of the present disclosure, a semiconductor structure includes a substrate comprising a first relaxed semiconductor material with a first lattice constant. A semiconductor device layer overlies the substrate, wherein the semiconductor device layer includes a second relaxed semiconductor material with a second lattice constant different from the first lattice constant. Lastly, a dielectric layer is interposed between the substrate and the semiconductor device layer, wherein the dielectric layer includes a programmed transition zone disposed within the dielectric layer for transitioning between the first lattice constant and the second lattice constant. The programmed transition zone includes a plurality of layers, adjoining ones of the plurality of layers having different lattice constants with one of the adjoining ones having a first thickness exceeding a first critical thickness required to form defects and another of the adjoining ones having a second thickness not exceeding a second critical thickness. Each adjoining layer of the plurality of layers forms an interface for promoting defects in the transition zone to migrate to and terminate on an edge of the programmed transition zone. A method of making the semiconductor structure is also disclosed.

BRIEF DESCRIPTION OF THE DRAWINGS

The embodiments of the present disclosure are illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve an understanding of the embodiments of the present disclosure.

DETAILED DESCRIPTION

According to the embodiments of the present disclosure, a combination of insertion layers, such as SiGeC or SiC or Si, with a T-shaped isolation or an inverse slope isolation (ISI) effectively reduces threading dislocations in a SiGe base layer and in a corresponding strained Si layer for SS devices. In one embodiment, the combination of inserting layers (e.g., SiGeC, SiC or Si or similar) in a SiGe base layer has been shown to dramatically reduce the threading dislocation density to on the order of less than $10^5$ per square centimeter with stepwise graded SiGe/SiGeC layers of approximately 1.20 $\mu$m using blanket wafers. Moreover, by inserting layers with "T" shape and ISI isolation for SS devices in an effective way, the embodiments enable obtaining greatly reduce TDs, to increase trench angles and create shallower trenches, and therefore reduce the thickness of the SiGe base layer, to scale device sizes effectively, and to improve SS device performance and reliability.

Accordingly, the embodiments of the present disclosure substantially reduce the demand for a thick SiGe buffer layer. In addition, the "T" shape and ISI isolation methods provide for increased active device areas on a substrate, while at the same time reducing a defect density in the SS devices. Moreover, the thickness of the SiGe base layer can be further reduced through use of a wider angle and shallower trenches of the inverse slope isolation and T-shaped isolation structures, respectively.

Figure 1:
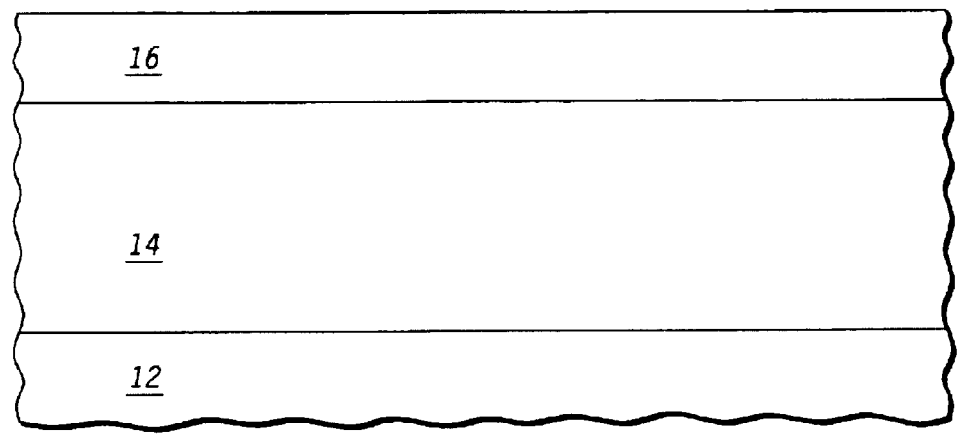
FIG. 1 is a cross-sectional view of a portion of a semiconductor structure to be fabricated on a semiconductor substrate and having first and second dielectric layers according to one embodiment of the present disclosure.

Turning now to the Figures, FIG. 1 is a cross-sectional view of a portion of a semiconductor structure to be fabricated on a semiconductor substrate and having first and second dielectric layers according to one embodiment of the present disclosure. In particular, a portion of a semiconductor structure 10 is fabricated on a semiconductor substrate 12 and having first and second dielectric layers (14,16), respectively. The first and second dielectric layers (14,16) can be deposited or grown using methods common to semiconductor device fabrication, such as LPCVD, PECVD, thermal oxidation, or the like. In one embodiment, substrate 12 comprises a Si substrate. However, in alternate embodiments, substrate 12 may also include other materials such as SiGe, GaAs, InP, AlAs, and the like. In addition, for high quality semiconductor device fabrication, substrate 12 includes a relaxed, single crystal material with very low defect concentrations.

Referring still to FIG. 1, dielectric layer 16 includes a material that is chosen such that it can be etched selectively with respect to the material of dielectric layer 14. For example, in a materials system wherein substrate 12 comprises Si, dielectric layer 14 can include silicon dioxide having a thickness on the order of approximately 3000–4000 angstroms and dielectric layer 16 can include silicon nitride having a thickness on the order of approximately 500 angstroms.

Figure 2:
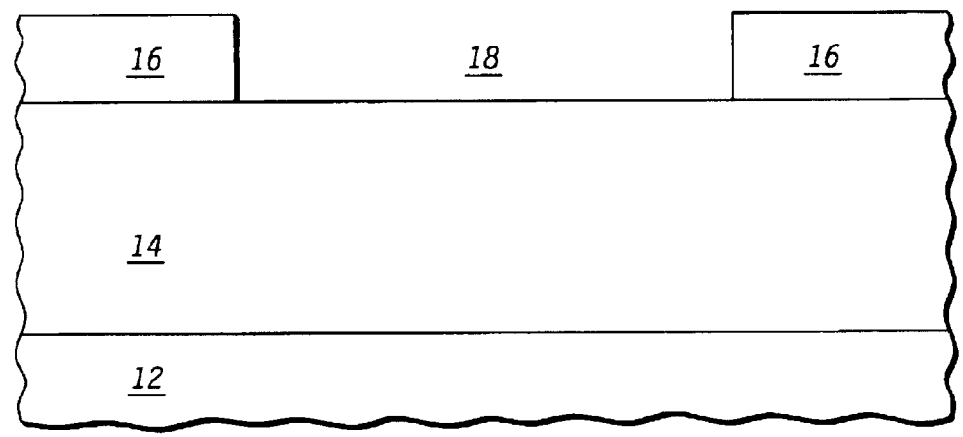
FIG. 2 is a cross-sectional view of the portion of the semiconductor substrate of FIG. 1 after forming an active region opening in the second dielectric layer.

FIG. 2 is a cross-sectional view of the portion of the semiconductor substrate of FIG. 1 after forming an active region opening in the second dielectric layer 16. In particular, FIG. 2 illustrates semiconductor stricture 10 after an active region opening 18 has been selectively patterned and etched in dielectric layer 16. Patterning and etching of dielectric layer 16 can be accomplished using commonly known photolithographic patterning and etch processes.

Figure 3:
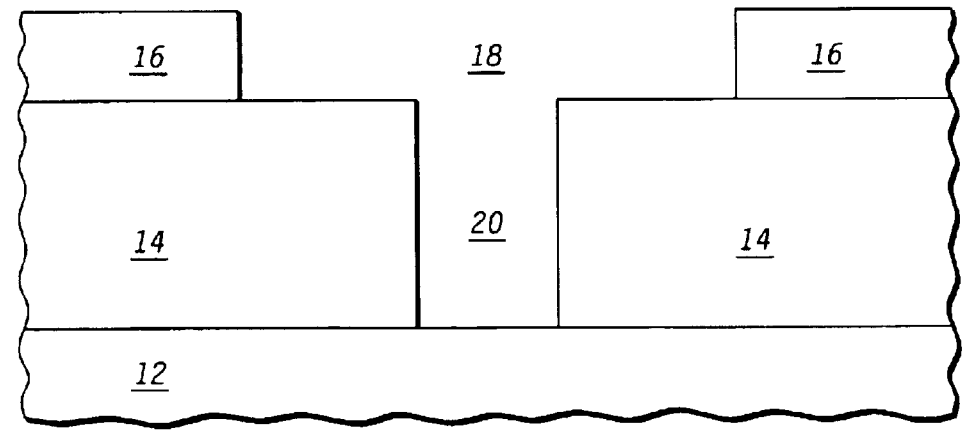
FIG. 3 is a cross-sectional view of the portion of the semiconductor substrate of FIG. 2 after forming a substrate via in the first dielectric layer.

FIG. 3 is a cross-sectional view of the portion of the semiconductor substrate of FIG. 2 after forming a substrate via in the first dielectric layer. In particular, FIG. 3 illustrates semiconductor structure 10 after a substrate via 20 has been selectively patterned and etched into dielectric layer 14, further within an area of the active region opening 18 of dielectric layer 16. Patterning and etching can be accomplished using commonly known photolithographic patterning and etch processes.

Figure 4:
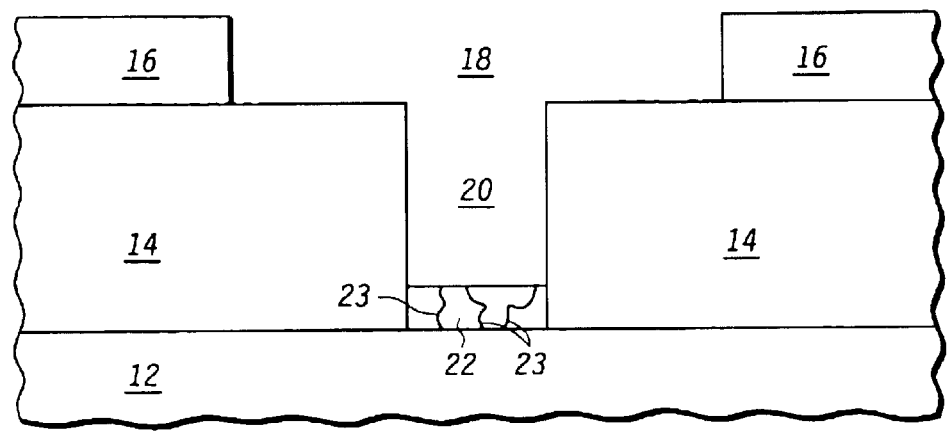
FIG. 4 is a cross-sectional view of the portion of the semiconductor substrate of FIG. 3 after a first semiconductor material has been deposited into the substrate via.

FIG. 4 is a cross-sectional view of the portion of the semiconductor substrate of FIG. 3 after a first semiconductor material has been deposited into the substrate via. More particularly, FIG. 4 illustrates semiconductor structure 10 after a semiconductor material 22 has been deposited into substrate via 20. Material 22 can be deposited epitaxially onto the substrate material 12 within substrate via 20. In addition, material 22 includes a material having a different lattice constant than that of the substrate material 12.

For example, in one embodiment, substrate material 12 includes Si and semiconductor material 22 includes SiGe. Since material 22 is of a different lattice constant than that of substrate material 12, a strain is imposed upon the epitaxially deposited material 22. Material 22 is deposited to a desired thickness also, wherein the desired thickness exceeds a critical thickness for defect formation to relax strain forming defects 23. Furthermore, deposition of semiconductor material 22 is performed selectively such that no material 22 is deposited on either of dielectric layer 14 or dielectric layer 16. The deposition of material 22 can be performed using common methods such as RPCVD, LPCVD, UHCVD, PECVD, PACVD, or RTCVD.

Figure 5:
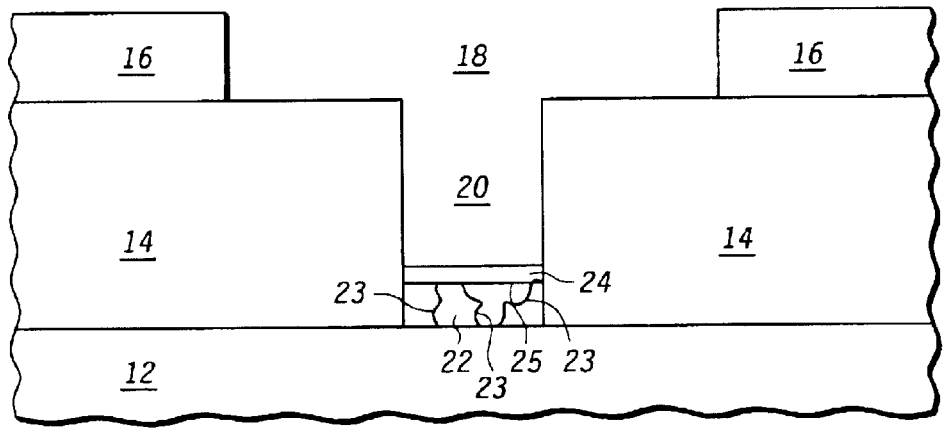
FIG. 5 is a cross-sectional view of the portion of the semiconductor substrate of FIG. 4 after a second material has been deposited on the first semiconductor material in the substrate via, forming an interface where the second material adjoins the first material.

FIG. 5 is a cross-sectional view of the portion of the semiconductor substrate of FIG. 4 after a second material has been deposited on the first semiconductor material in the substrate via, forming an interface where the second material adjoins the first material. In particular, FIG. 5 illustrates the semiconductor structure 10 after a material 24 has been deposited on material 22, thus forming an interface 25 at a location where the second material 24 adjoins the first material 22. In one embodiment, material 24 is deposited epitaxially on material 22 selective to dielectric material of layer 14 and the dielectric material of layer 16. In addition, material 24 is selected to have a lattice constant different from that of material 22. For example, in the embodiment where semiconductor structure 10 includes a Si substrate 12 and material 22 is SiGe, material 24 can include SiGeC, SiC, Si, or the like. In addition, interface 25 promotes defects in material 22, that would otherwise tend to propagate upwards during subsequent epitaxial deposition, to migrate to and terminate at an edge of the substrate via 20.

Figure 6:
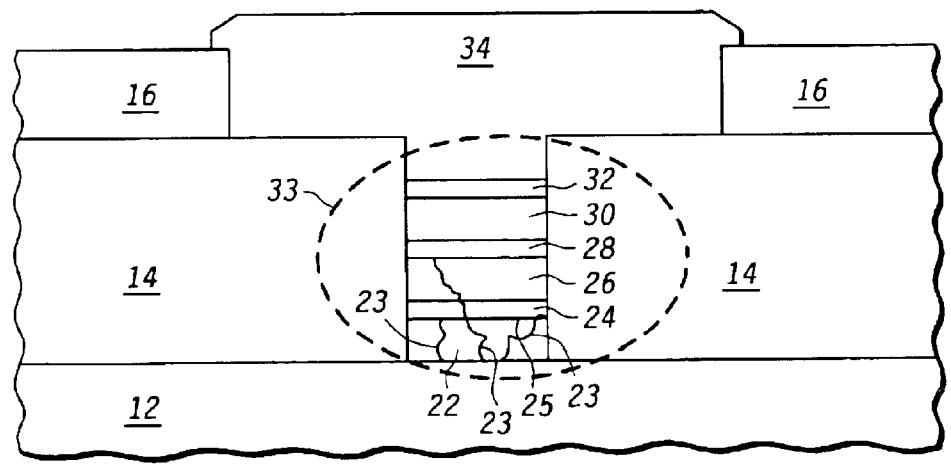
FIG. 6 is a cross-sectional view of the portion of the semiconductor substrate of FIG. 5 after a plurality of material layers have been epitaxiatly deposited selective to first and second dielectric layers to form a programmed transition zone according to one embodiment of the present disclosure.

FIG. 6 is a cross-sectional view of the portion of the semiconductor substrate of FIG. 5 after a plurality of material layers have been epitaxially deposited selective to first and second dielectric layers to form a programmed transition zone according to one embodiment of the present disclosure. More particularly, FIG. 6 illustrates the semiconductor structure 10 after material layers 26, 28, 30, 32, and 34 have been epitaxially deposited selective to dielectric 14 and dielectric 16, wherein material layers 26, 28, 30, 32, and 34 form the programmed transition zone 33. Layers 22, 24, 26, 28, 30, and 32 are transition layers. The material of layers 22, 24, 26, 28, 30, and 32 are chosen such that the strain resulting from the difference in lattice constant between the substrate material 12 and the semiconductor device layer 34 is completely relieved within the programmed transition zone and that all defects are terminated within the programmed transition zone.

In one embodiment, for a materials system where the substrate 12 includes Si, layers 22, 26, 30, and 34 can include SiGe layers having a Ge concentration on the order of approximately 30 atomic %. In addition, layers 24, 28, and 32 can include SiGeC layers having a Ge concentration on the order of approximately 25 atomic % and further having a C concentration on the order of approximately 3 atomic %. Furthermore, it is unnecessary for any of the various layers in the programmed transition zone to be of identical composition or lattice constant. The materials of the layers are chosen such that the programmed transition zone substantially completely relieves the strain between the single crystal substrate material 12 and the single crystal semiconductor device layer 34.

Figure 7:
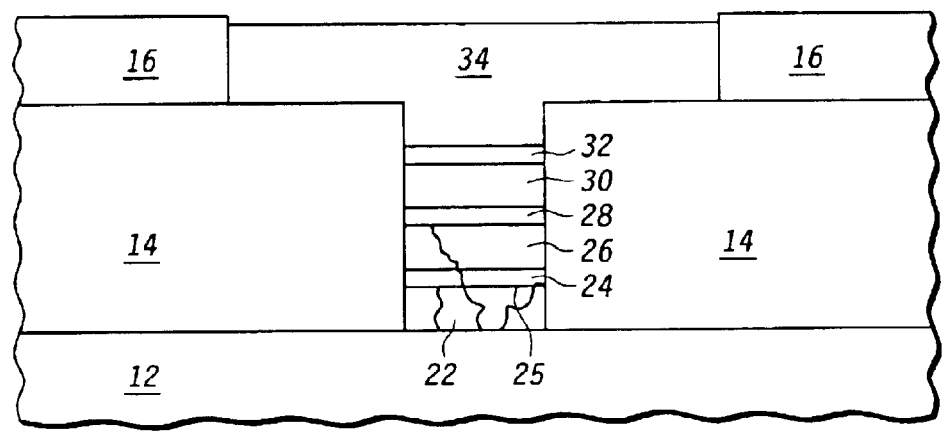
FIG. 7 is a cross-sectional view of the portion of the semiconductor substrate of FIG. 6 after an uppermost semiconductor device layer has been planarized.

FIG. 7 is a cross-sectional view of the portion of the semiconductor substrate of FIG. 6 after an uppermost semiconductor device layer has been planarized. That is, FIG. 7 illustrates semiconductor structure 10 after the semiconductor device layer 34 has been planarized. Planarization of layer 34 can be accomplished using conventional semiconductor device fabrication and planarization techniques, such as, CMP or plasma etchback. In a preferred embodiment, the upper surface of semiconductor device layer 34 would be recessed slightly relative to an upper surface of dielectric layer 16.

Figure 8:
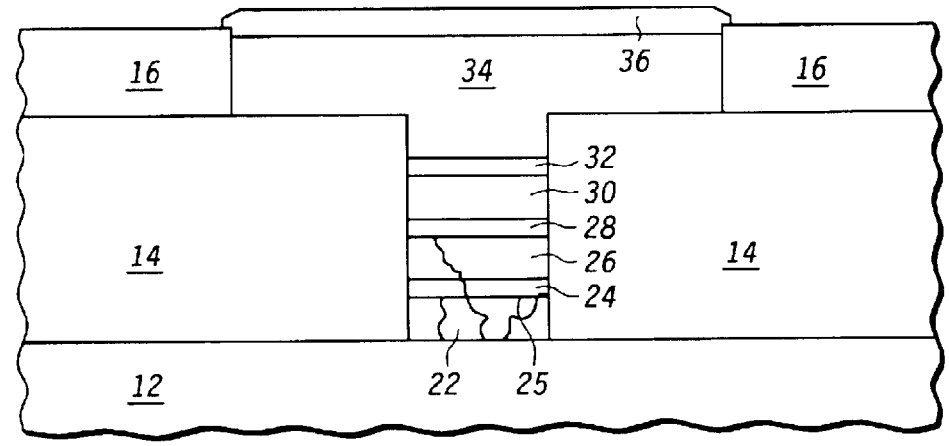
FIG. 8 is a cross-sectional view of the portion of the semiconductor substrate of FIG. 7 after a strained material layer has been epitaxially deposited on the planarized semiconductor device layer according to an embodiment of the present disclosure.

FIG. 8 is a cross-sectional view of the portion of the semiconductor substrate of FIG. 7 after a strained material layer has been epitaxially deposited on the planarized semiconductor device layer according to an embodiment of the present disclosure. More particularly, FIG. 8 illustrates semiconductor structure 10 after strained material layer 36 is epitaxially deposited onto semiconductor device layer 34. In addition, strained material layer 36 is deposited selectively to dielectric layer 16 using conventional semiconductor device fabrication techniques, such as, LPCVD or RTCVD.

In one embodiment, for a materials system in which semiconductor device layer 34 includes SiGe having a Ge concentration on the order of approximately 30–35 atomic %, the strained material layer 36 includes Si. Furthermore, the thickness of strained material layer 36 must be less than a critical layer thickness of the material of layer 36 above which defects would form in layer 36 that would relieve the strain. For the materials system described above, the typical thickness of Si strained layer 36 on relaxed semiconductor device layer 34 of approximately 30–35 atomic % Ge in SiGe is on the order of less than 150 Å.

Figure 9:
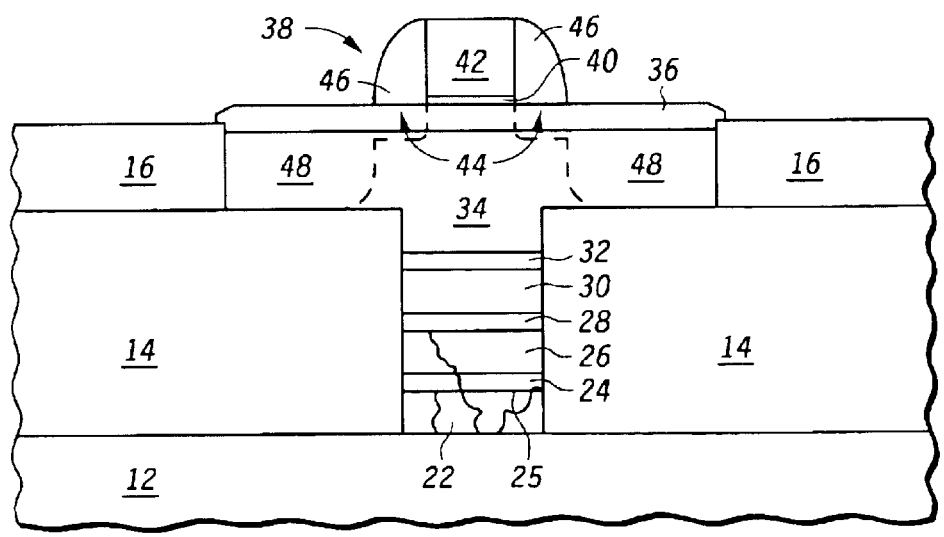
FIG. 9 is a cross-sectional view of the portion of the semiconductor substrate of FIG. 8 after a conventional MOSFET has been fabricated using the semiconductor device layer and strained material layer according to an embodiment of the present disclosure.

FIG. 9 is a cross-sectional view of the portion of the semiconductor substrate of FIG. 8 after a conventional MOSFET has been fabricated using the semiconductor device layer and strained material layer according to an embodiment of the present disclosure. In particular, FIG. 9 illustrates semiconductor structure 10 after a conventional MOSFET device 38 has been fabricated, device 38 making use of semiconductor device layer 34 and strained material layer 36. In the fabrication of MOSFET device 38, gate dielectric material 40 is grown or deposited onto strained material layer 36. A gate electrode material 42 is then deposited onto gate dielectric material 40 and patterned and etched, using conventional semiconductor device fabrication methods such as photolithography patterning and etch. Extension implant regions 44 are then formed and sidewall spacers 46 fabricated using state of the art semiconductor device fabrication methods. Subsequently, deep source/drain regions 48 are then formed.

In the MOSFET device 38 of FIG. 9, strained layer 36 forms the channel of the MOSFET device. An increased mobility of charge carriers in strained layer 36 results in improved performance for the MOSFET device as compared to a MOSFET device fabricated using standard shallow trench isolation with an unstrained channel.

Figure 10:
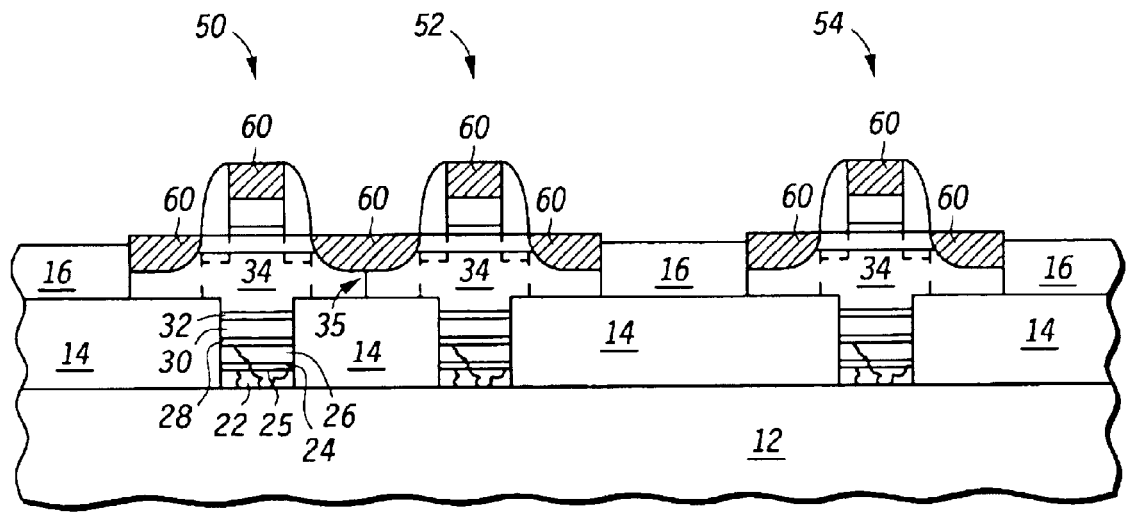
FIG. 10 is a cross-sectional view of a portion of a semiconductor structure comprised of semiconductor MOSFET devices having been fabricated using the method according to one embodiment of the present disclosure, as outlined in FIGS. 1 through 9.

FIG. 10 is a cross-sectional view of a portion of a semiconductor structure comprised of semiconductor MOSFET devices having been fabricated using the method according to one embodiment of the present disclosure, as outlined in FIGS. 1 through 9. In particular, FIG. 10 illustrates a semiconductor structure 100 comprised of semiconductor MOSFET devices 50, 52, and 54 that have been fabricated using the method outlined and discussed herein with respect to FIGS. 1 through 9. In semiconductor structure 100, seam 35 is present in a location where the semiconductor device layer 34 has been deposited in adjacent devices 50 and 52 to create a shared source/drain device electrode. While FIG. 10 shows the MOSFET directly above the area of the programed transition zone, this is not a requirement. That is, the MOSFET or MOSFETs can be anywhere within the device layer 34.

Referring still to FIG. 10, silicide regions 60 are shown, wherein silicide regions 60 have been formed using conventional salicide process techniques. The silicide in region 60 on shared source/drain device electrodes of devices 50 and 52 minimizes any resistance due to seam 35. The illustration of FIG. 10 shows an example of where adjacent devices manufactured according to the embodiments of the present disclosure can be further integrated in a fashion substantially similar to current device layout methods with common source/drain areas.

Figure 11:
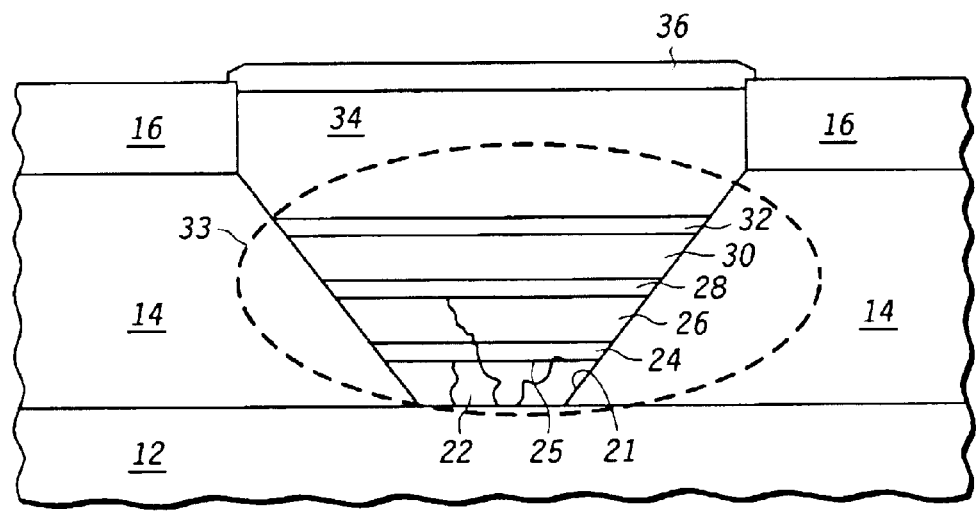
FIG. 11 is a cross-sectional view of a portion of a semiconductor substrate having a strained material layer on a planarized semiconductor device layer according to another embodiment of the present disclosure.

FIG. 11 is a cross-sectional view of a portion of a semiconductor substrate having a strained material layer on a planarized semiconductor device layer according to another embodiment of the present disclosure. More particularly, FIG. 11 illustrates an alternate embodiment comprised of a semiconductor structure 150 fabricated using methods similar to the process discussed herein above and illustrated in FIGS. 1 through 8. Instead of a two mask processed used to create the "T" shaped structure first illustrated in FIG. 3, a single etch process can be used. The alternate embodiment includes the single etch process first etching dielectric layer 16, then continuing the etch in dielectric 14, while tailoring the process to create a sloped profile 21 in dielectric 14 (inverse slope isolation).

Layers 22, 24, 26, 28, 30, 32, and 34 are deposited, as discussed herein above, for forming the programmed transition zone 33 between the substrate material 12 and the semiconductor device layer 34. Materials in layers 22, 24, 26, 28, 30, 32, and 34 are chosen such that the strain between substrate material 12 and semiconductor device layer 34 due to the difference in lattice constant is completely relieved within the programmed transition zone 33 and all defects relieving the strain are terminated within the programmed transition zone 33. Strained material layer 36 is then deposited on the fully relaxed semiconductor device layer 34 and selective to dielectric layer 16 as previously described. Moreover, the embodiment of FIG. 11 exemplifies how a different isolation structure, such as involving an inverse slope isolation, is also suitable for application of the structure disclosed herein to minimize or eliminate defects due to strain relaxation.

According to an embodiment of the present disclosure, a semiconductor structure includes a substrate of a first relaxed semiconductor material with a first lattice constant.

A semiconductor device layer overlies the substrate, wherein the semiconductor device layer includes a second relaxed semiconductor material with a second lattice constant different from the first lattice constant. The semiconductor structure further includes a dielectric layer interposed between the substrate and the semiconductor device layer. The dielectric layer includes a programmed transition zone disposed within the dielectric layer for transitioning between the first lattice constant and the second lattice constant.

The programmed transition zone comprises a plurality of layers. Adjoining ones of the plurality of layers have different lattice constants, wherein one of the adjoining ones has a first thickness exceeding a first critical thickness required to form defects and another of the adjoining ones has a second thickness not exceeding a second critical thickness. Each adjoining layer of the plurality of layers forms an interface for promoting defects in the transition zone to migrate defects to and terminate defects on an edge of the programmed transition zone.

In one embodiment, a material composition of at least one of the adjoining pairs of the plurality of layers differs from all other pairs of the plurality of layers. In another embodiment, the plurality of layers can further comprise a plurality of pairs of transition layers, a first of each of the pairs of transition layers comprising a predetermined percentage of germanium wherein the predetermined percentage varies between at least two of the pairs of transition layers.

In one embodiment, the programmed transition zone comprises a via having sidewalls that are substantially perpendicular to the substrate. In another embodiment, the programmed transition zone comprises a via having sidewalls that are slanted and intersect with the substrate at an angle other than ninety degrees.

In addition to the above, according to another embodiment of the present disclosure, the semiconductor structure further includes a strained material layer overlying the semiconductor device layer. The strained material layer has a thickness that is less than its critical thickness in order to minimize defects and maintain strain. The semiconductor structure may further include a transistor control electrode overlying the strained material layer, and transistor current electrodes positioned adjacent the strained material layer, the strained material layer functioning as a channel of the transistor.

In yet another embodiment of the present disclosure, a semiconductor device structure includes substrate means, dielectric layer means, and a semiconductor device layer means. The substrate means includes a first relaxed material having a first lattice constant. The dielectric layer means includes an opening for defining a programmed transition zone to transition from the first relaxed material having the first lattice constant to a different lattice constant material. The programmed transition zone comprises a plurality of layers, each having a composition that is dissimilar from any adjoining layer of the plurality of layers to form an interface for promoting defects to migrate to and terminate on an edge of the programmed transition zone. Predetermined alternating layers of the plurality of layers have a thickness that exceeds a critical thickness for its material composition to form defects to relieve strain. Lastly, intervening layers of the plurality of layers have a thickness that does not exceed a critical thickness for its material composition to be strained, wherein an upper layer of the plurality of layers is substantially defect free. The semiconductor device layer means overlies at least the programmed transition zone and further comprises a second relaxed material having a second lattice constant that is the different lattice constant material.

The semiconductor device structure of the preceding paragraph can further comprise a strained material layer means overlying the semiconductor layer means, the strained material layer means functioning as a material having increased charge carrier mobility for an element of the semiconductor device structure. In one embodiment, the strained material layer means includes strained silicon. In addition, the semiconductor device can further include a transistor control electrode means overlying the strained material layer means; and a current electrode means formed within the semiconductor device layer means and adjoining the transistor control electrode means to form a transistor wherein the strained material layer means functions as a channel of the transistor.

Still further, in the embodiment of the semiconductor device structure of the preceding paragraphs, the programmed transition zone can further include: a first of the plurality of layers overlying the substrate means and comprising one of silicon germanium, gallium arsenide and aluminum arsenide; a second of the plurality of layers overlying the first of the plurality of layers, the second of the plurality of layers comprising one of silicon germanium carbon, silicon carbon, silicon, silicon germanium, gallium arsenide and aluminum arsenide; a third of the plurality of layers overlying the second of the plurality of layers, the third of the plurality of layers comprising one of silicon germanium carbon, silicon carbon, silicon, silicon germanium, gallium arsenide and aluminum arsenide; a fourth of the plurality of layers overlying the third of the plurality of layers, the fourth of the plurality of layers comprising one of silicon germanium, gallium arsenide and aluminum arsenide; and one or more additional layers of the plurality of layers overlying the fourth of the plurality of layers, a final of the one or more additional layers being a substantially defect free material.

The programmed transition zone of the semiconductor device structure may further comprise a via formed in the dielectric layer means, the via having sidewalls that are non-orthogonal to the substrate means. The substrate means of the semiconductor structure may still further comprise a material composed of one of silicon, gallium arsenide, aluminum arsenide, gallium phosphorous and indium phosphorous.

In yet another embodiment, a method of forming a semiconductor device structure comprises forming a substrate means comprising a first relaxed material, the first relaxed material having a first lattice constant. A dielectric layer means is formed overlying the substrate means, the dielectric layer means having an opening for defining a programmed transition zone to transition from the first relaxed material having the first lattice constant to a different lattice constant material. Next, a programmed transition zone is formed with a plurality of layers, each of the plurality of layers comprising a composition that is dissimilar from any adjoining layer of the plurality of layers to form an interface for promoting defects to migrate to and terminate on an edge of the programmed transition zone.

Predetermined alternating layers are formed of the plurality of layers with a thickness that exceeds a critical thickness for its material composition to form defects to relieve strain. Intervening layers of the plurality of layers are also formed that intervene the predetermined alternating layers with a thickness that does not exceed a critical thickness for its material composition to be strained, wherein an upper layer of the plurality of layers is substantially defect free. Lastly, a semiconductor device layer means is formed overlying at least the programmed transition zone, the semiconductor device layer means comprising a second relaxed material having a second lattice constant that is the different lattice constant.

The method can further include forming a strained material layer overlying the semiconductor device layer means. The strained material layer is formed with a thickness that is less than its critical thickness in order to minimize defects and maintain strain. The method can also further include forming a transistor by forming current electrode diffusions within the semiconductor device layer means and forming a gate electrode overlying and separated from the strained material layer by a dielectric layer means, the strained material layer functioning as a channel of the transistor.

Moreover, according to the embodiments of the present disclosure, inverse slope isolation and T-shaped isolation have been disclosed which provide a structure within a non-active device region of a device to terminate defects associated with strain relaxation. Such a structure includes a programmed transition region that promotes the termination of defects on the sidewalls of the isolation structure. Advantages of the embodiments of the present disclosure include defect termination, strain relief, as well as other advantages. Defect termination occurs on the sidewalls of the substrate via or the inverse slope isolation structure and is promoted through the use of the interfaces between layers 22, 24, 26, 28, 30, 32, and 34. Strain relief can be promoted in a smaller vertical span (corresponding to a thickness of dielectric layer 14) because many more defects can be formed and terminated in the programmed transition region than in a region of constant composition or of ramped composition without distinct interfaces inside the transition region.

While the various embodiments have been discussed as presented herein above, other types of insertion layers are possible. Such other types can include a SiGe superlattice, Si, and Si-X, where X is a desired element that can effectively modulate the Si lattice, but does not affect the pseudomorphic growth. For example, the element can include any Si alloy, Si oxides/nitrides, etc, and can also include Si-X-Y systems in a similar fashion.

In the foregoing specification, the disclosure has been described with reference to various embodiments. However, one of ordinary skill in the art appreciates that various modifications and changes can be made without departing from the scope of the present embodiments as set forth in the claims below. Accordingly, the specification and figures are to be regarded in an illustrative rather than a restrictive sense, and all such modifications are intended to be included within the scope of the present embodiments.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms a or an, as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically.

We claim:

1. A semiconductor structure comprising:

a substrate comprising a first relaxed semiconductor material with a first lattice constant;

a semiconductor device layer overlying the substrate, the semiconductor device layer comprising a second relaxed semiconductor material with a second lattice constant different from the first lattice constant; and a dielectric layer interposed between the substrate and the semiconductor device layer, the dielectric layer having a programmed transition zone disposed within the dielectric layer for transitioning between the first lattice constant and the second lattice constant, the programmed transition zone comprising a plurality of layers, adjoining ones of the plurality of layers having different lattice constants with one of the adjoining ones having a first thickness exceeding a first critical thickness required to form defects and another of the adjoining ones having a second thickness not exceeding a second critical thickness, each adjoining layer of the plurality of layers forming an interface for promoting defects in the transition zone to migrate to an edge of the programmed transition zone.

2. The semiconductor structure of claim 1 wherein the programmed transition zone comprises a via having sidewalls that are substantially perpendicular to the substrate.

3. The semiconductor structure of claim 1 wherein the programmed transition zone comprises a via having sidewalls that are slanted and intersect with the substrate at an angle other than ninety degrees.

4. The semiconductor structure of claim 1 further comprising:

a strained material layer overlying the semiconductor device layer, the strained material layer having a thickness that is less than its critical thickness in order to minimize defects and maintain strain.

5. The semiconductor device of claim 4 further comprising:

a transistor control electrode overlying the strained material layer; and transistor current electrodes positioned adjacent the strained material layer, the strained material layer functioning as a channel of the transistor.

6. The semiconductor device of claim 1 wherein a material composition of at least one of adjoining pairs of the plurality of layers differs from all other pairs of the plurality of layers.

7. The semiconductor device of claim 1 wherein the plurality of layers further comprise a plurality of pairs of transition layers, a first of each of the pairs of transition layers comprising a predetermined percentage of germanium wherein the predetermined percentage varies between at least two of the pairs of transition layers.

8. A semiconductor device structure comprising:

substrate means comprising a first relaxed material, the first relaxed material having a first lattice constant;

a dielectric layer means having an opening for defining a programmed transition zone to transition from the first relaxed material having the first lattice constant to a different lattice constant material, the programmed transition zone comprising a plurality of layers, each having a composition that is dissimilar from any adjoining layer of the plurality of layers to form an interface for promoting defects to migrate to an edge of the programmed transition zone, predetermined alternating layers of the plurality of layers having a thickness that exceeds a critical thickness for its material composition to form defects to relieve strain, and intervening layers of the plurality of layers having a thickness that does not exceed a critical thickness for its material composition to be strained, wherein an upper layer of the plurality of layers is substantially defect free; and a semiconductor device layer means overlying at least the programmed transition zone, the semiconductor device layer means comprising a second relaxed material having a second lattice constant that is the different lattice constant material.

9. The semiconductor device structure of claim 8 further comprising:

a strained material layer means overlying the semiconductor layer means, the strained material layer means functioning as a material having increased charge carrier mobility for an element of the semiconductor device structure.

10. The semiconductor device structure of claim 9 wherein the strained material layer means further comprise strained silicon.

11. The semiconductor device structure of claim 9 further comprising:

transistor control electrode means overlying the strained material layer means; and current electrode means formed within the semiconductor device layer means and adjoining the transistor control electrode means to form a transistor wherein the strained material layer means functions as a channel of the transistor.

12. The semiconductor device structure of claim 8 wherein the programmed transition zone further comprises:

a first of the plurality of layers overlying the substrate means and comprising one of silicon germanium, gallium arsenide and aluminum arsenide;

a second of the plurality of layers overlying the first of the plurality of layers, the second of the plurality of layers comprising one of silicon germanium carbon, silicon carbon, silicon, silicon germanium, gallium arsenide and aluminum arsenide;

a third of the plurality of layers overlying the second of the plurality of layers, the third of the plurality of layers comprising one of silicon germanium carbon, silicon carbon, silicon, silicon germanium, gallium arsenide and aluminum arsenide;

a fourth of the plurality of layers overlying the third of the plurality of layers, the fourth of the plurality of layers comprising one of silicon germanium, gallium arsenide and aluminum arsenide; and one or more additional layers of the plurality of layers overlying the fourth of the plurality of layers, a final of the one or more additional layers being a substantially defect free material.

13. The semiconductor device structure of claim 8 wherein the programmed transition zone further comprises:

a via formed in the dielectric layer means, the via having sidewalls that are non-orthogonal to the substrate means.

14. The semiconductor device structure of claim 8 wherein the substrate means further comprise a material composed of one of silicon, gallium arsenide, aluminum arsenide, gallium phosphorous and indium phosphorous.

15. A method of forming a semiconductor device structure comprising:

forming a substrate means comprising a first relaxed material, the first relaxed material having a first lattice constant;

forming a dielectric layer means overlying the substrate means, the dielectric layer means having an opening for defining a programmed transition zone to transition from the first relaxed material having the first lattice constant to a different lattice constant material;

forming the programmed transition zone with a plurality of layers, each of the plurality of layers comprising a composition that is dissimilar from any adjoining layer of the plurality of layers to form an interface for promoting defects to migrate to an edge of the programmed transition zone;

forming predetermined alternating layers of the plurality of layers with a thickness that exceeds a critical thickness for its material composition to form defects to relieve strain;

forming intervening layers of the plurality of layers that intervene the predetermined alternating layers with a thickness that does not exceed a critical thickness for its material composition to be strained, wherein an upper layer of the plurality of layers is substantially defect free; and forming a semiconductor device layer means overlying at least the programmed transition zone, the semiconductor device layer means comprising a second relaxed material having a second lattice constant that is the different lattice constant.

16. The method of claim 15 further comprising:

forming a strained material layer overlying the semiconductor device layer means, the strained material layer formed with a thickness that is less than its critical thickness in order to minimize defects and maintain strain.

17. The method of claim 15 further comprising:

forming a transistor by forming current electrode diffusions within the semiconductor device layer means and forming a gate electrode overlying and separated from the strained material layer by a dielectric layer means, the strained material layer functioning as a channel of the transistor.

18. The method of claim 15 further comprising:

epitaxially growing each of the plurality of layers.

19. A method of forming a semiconductor device comprising:

providing a substrate comprising a first relaxed semiconductor material with a first lattice constant;

providing a semiconductor device layer overlying the substrate, the semiconductor device layer comprising a second relaxed semiconductor material with a second lattice constant different from the first lattice constant; and interposing a dielectric layer between the substrate and the semiconductor device layer, the dielectric layer having a programmed transition zone disposed within the dielectric layer for transitioning between the first lattice constant and the second lattice constant; and forming the programmed transition zone with a plurality of layers, adjoining layers of the plurality of layers having different lattice constants with one of each of the adjoining layers having a first thickness exceeding a first critical thickness required to form defects and another of each of the adjoining layers having a second thickness not exceeding a second critical thickness, each adjoining layer of the plurality of layers forming an interface for promoting defects in the transition zone to migrate to an edge of the programmed transition zone, an upper surface of the programmed transition zone being substantially free of defects.

20. The method of claim 19 further comprising:

forming a strained material layer overlying the semiconductor device layer, the strained material layer having a thickness that is less than its critical thickness in order to minimize defects and maintain strain.

21. The method of claim 19 further comprising:

forming a transistor within the semiconductor device layer and overlying the strained materials layer, the transistor comprising a source and a drain implanted within the semiconductor device layer and comprising a gate overlying the strained material layer, the strained material layer functioning as a channel of the transistor.

* * * * *

UNITED STATES PATENT AND TRADEMARK OFFICE
CERTIFICATE OF CORRECTION

PATENT NO. : 6,831,350 B2  Page 1 of 1
APPLICATION NO. : 10/677844
DATED : October 2, 2003
INVENTOR(S) : Chun-Li Liu et al.

It is certified that error appears in the above-identified patent and that said Letters Patent is hereby corrected as shown below:

Column 14, Line 8, Claim No. 21:

Change "the strained materials" to --the strained material--

Signed and Sealed this

Sixth Day of May, 2008

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 6,831,350 B1 | Page 1 of 1 |
| APPLICATION NO. | : 10/677844 | |
| DATED | : December 14, 2004 | |
| INVENTOR(S) | : Chun-Li Liu et al. | |

It is certified that error appears in the above-identified patent and that said Letters Patent is hereby corrected as shown below:

Column 14, Line 8, Claim No. 21:

Change "the strained materials" to --the strained material--

This certificate supersedes the Certificate of Correction issued May 6, 2008.

Signed and Sealed this

Third Day of June, 2008

JON W. DUDAS
*Director of the United States Patent and Trademark Office*